United States Patent
Otremba et al.

(10) Patent No.: US 8,698,293 B2
(45) Date of Patent: Apr. 15, 2014

(54) MULTI-CHIP PACKAGE AND METHOD OF MANUFACTURING THEREOF

(75) Inventors: Ralf Otremba, Kaufbeuren (DE); Josef Hoeglauer, Kirchhein-Heimstetten (DE); Juergen Schredl, Mering (DE)

(73) Assignee: Infineon Technologies AG, Neubiberg (DE)

( * ) Notice: Subject to any disclaimer, the term of this patent is extended or adjusted under 35 U.S.C. 154(b) by 21 days.

(21) Appl. No.: 13/481,630

(22) Filed: May 25, 2012

(65) Prior Publication Data

US 2013/0313712 A1 Nov. 28, 2013

(51) Int. Cl.
*H01L 23/02* (2006.01)
*H01L 23/48* (2006.01)
*H01L 23/52* (2006.01)
*H01L 29/40* (2006.01)
*H01L 21/44* (2006.01)
*H01L 21/48* (2006.01)
*H01L 21/50* (2006.01)

(52) U.S. Cl.
USPC ............ 257/685; 257/773; 257/E23.001; 257/E23.142; 438/123

(58) Field of Classification Search
USPC ......... 257/685–686, 690–691, 734, 773, 777, 257/E23.001, E23.142, E23.151, E23.169, 257/E23.175, E23.178, E21.575; 438/123
See application file for complete search history.

(56) References Cited

U.S. PATENT DOCUMENTS

| | | | | |
|---|---|---|---|---|
| 6,946,740 B2 * | 9/2005 | Schaffer | | 257/777 |
| 7,071,550 B2 * | 7/2006 | Sato | | 257/706 |
| 7,271,470 B1 * | 9/2007 | Otremba | | 257/666 |
| 7,304,372 B2 * | 12/2007 | Hu et al. | | 257/678 |
| 7,804,131 B2 * | 9/2010 | Cheah et al. | | 257/341 |
| 8,390,131 B2 * | 3/2013 | Fuchs et al. | | 257/778 |
| 2007/0090523 A1 * | 4/2007 | Otremba | | 257/727 |
| 2007/0216011 A1 | 9/2007 | Otremba et al. | | |
| 2007/0222044 A1 * | 9/2007 | Otremba | | 257/678 |
| 2007/0259514 A1 * | 11/2007 | Otremba | | 438/612 |
| 2007/0284720 A1 * | 12/2007 | Otremba et al. | | 257/690 |
| 2008/0087913 A1 * | 4/2008 | Otremba et al. | | 257/177 |
| 2008/0197463 A1 * | 8/2008 | Otremba | | 257/676 |
| 2009/0261468 A1 * | 10/2009 | Kroeninger et al. | | 257/690 |
| 2010/0078783 A1 * | 4/2010 | Otremba | | 257/676 |

FOREIGN PATENT DOCUMENTS

DE 10 2006 012 781 A1 9/2007

* cited by examiner

*Primary Examiner* — David S Blum
(74) *Attorney, Agent, or Firm* — Slater & Matsil, L.L.P.

(57) ABSTRACT

A multi-chip package comprises a first chip accommodated in a first housing and a second chip accommodated in a second housing. The first housing and the second housing are arranged in a laterally spaced-apart relationship defining a gap between the first housing and the second housing. An interconnecting structure is configured to span the gap and to electrically couple the first chip and the second chip.

30 Claims, 10 Drawing Sheets

MULTI-CHIP PACKAGE AND METHOD OF MANUFACTURING THEREOF

TECHNICAL FIELD

The invention relates to multi-chip packages and a method of manufacturing a multi-chip package.

BACKGROUND

In the semiconductor area, a chip may carry a circuit, for example an IC (Integrated Circuit) implementing a potentially complex logic by a potentially large number of circuit elements, for example in the field of low voltages, low currents, and/or low frequencies. Other chips, for example power semiconductor chips in the field of high voltage, high current, and/or high frequency applications, may implement only one or a few number of semiconductor or circuit elements, such as a power transistor, a power diode, etc.

There is a tendency to implement more and more applications in the electric and electronic field in a chip-based fashion. This may include power applications to be implemented by means of chip-based power semiconductor elements such as power transistors, power diodes, etc., and may additionally or alternatively include, for example, HV (High Voltage)-enabled control logic for controlling such power elements. A power application may include, for example, a power supply, a power converter, a switched-mode converter, an alternating current (AC)/direct current (DC) converter, a DC/DC converter, etc. Such applications may be employed in diverse equipment such as in the fields of power supplies for personal computer (PC) components, electronic lighting equipment, battery-based equipment, etc.

When implementing a HV application in a single-chip or multi-chip device, for example a multi-chip package or multi-chip module (MCM), high voltages may occur between contact terminals of the device. The respective contact terminals therefore have to be spaced apart by sufficient isolation distances to minimize creepage currents (leakage currents). Depending on voltage, a pair of contact terminals may have to be separated by a spacing in the range of, for example, millimeters or more. Adherence to predefined creepage distances may in this way lead to an increase in device size, which in turn may lead to an increase in costs.

Consequently, there is a general need for cost-efficient solutions in the field of high voltage applications.

SUMMARY OF THE INVENTION

According to one aspect of the present disclosure, a multi-chip package comprises a first chip accommodated in a first housing and a second chip accommodated in a second housing. The first housing and the second housing are arranged in a laterally spaced-apart relationship defining a gap between the first housing and the second housing. An interconnecting structure is configured to span the gap between the first housing and the second housing. The interconnecting structure is configured to electrically couple the first chip and the second chip.

BRIEF DESCRIPTION OF THE DRAWINGS

The accompanying drawings are included to provide a thorough understanding of various aspects of the present disclosure and are incorporated in and constitute a part of this specification. The drawings illustrate different embodiments and together with the description serve to explain miscellaneous aspects thereof. Other embodiments, aspects and advantages will be readily appreciated as they become better understood by reference to the following detailed description.

In the figures and the description like reference numerals are generally utilized to refer to like elements throughout. It is to be noted that the various elements and structures shown in the figures are not necessarily drawn to scale. Features and/or elements are illustrated with particular dimensions relative to each other primarily for sake of clarity and ease of understanding; as a consequence, relative dimensions in factual implementations may differ substantially from those illustrated herein.

DETAILED DESCRIPTION OF ILLUSTRATIVE EMBODIMENTS

Figure 1:
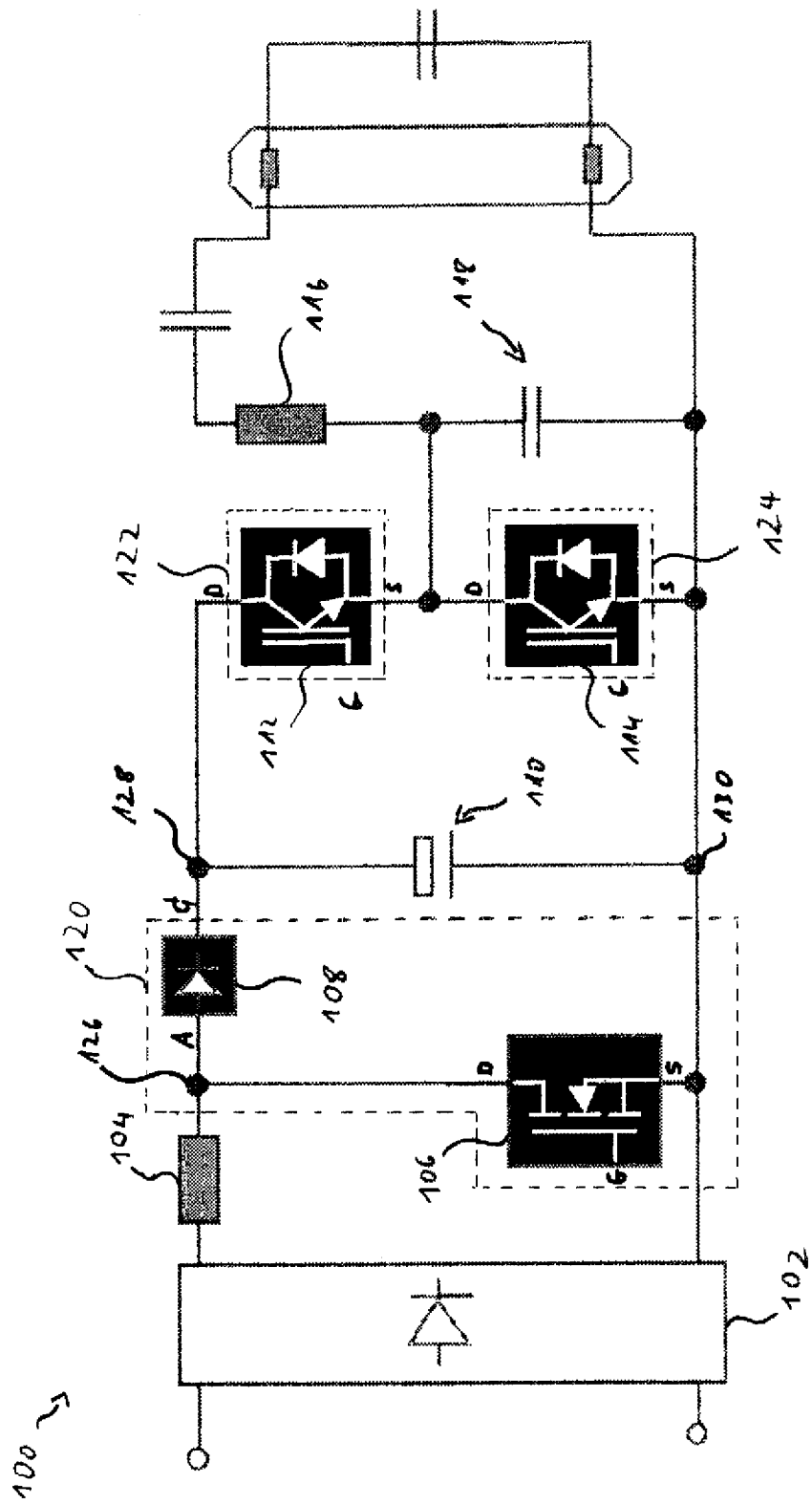
FIG. 1 is a circuit diagram illustrating an embodiment of a power circuit comprising various multi-chip packages.

In the following description, for purposes of explanation and not limitation, by reference to the accompanying drawings, various embodiments are set forth including many specific details in order to provide a thorough understanding of the current disclosure. It is to be understood that other embodiments, which differ in one or more of these specific details, can be practiced without departing from the scope of the present disclosure. Accordingly, the following description is intended for illustrative, non-limiting purposes only, and the scope of the present invention shall be defined solely by the appended claims.

The terms "coupled" and "connected," along with derivatives may be used herein. It should be understood that these terms may be used to indicate that two elements co-operate or interact with each other regardless whether or not they are in direct physical or electrical contact with each other.

Chips are referred to herein. According to various embodiments of the disclosure, a chip may comprise an electric or electronic circuit fabricated on a substrate, wherein the circuit may include one or more semiconductor elements. Semiconductor elements as referred to herein can be implemented as active or passive semiconductor elements. Active semiconductor elements are generally understood as being adapted for an amplification function and/or for a controlling function, which is in contrast to passive semiconductor elements understood as not comprising amplifier and/or controlling functionality. Non-limiting examples of passive elements are resistors, capacitors, inductors, etc. Non-limiting examples of active elements are diodes, flip-chip diodes, transistors, IGBTs, ICs (Integrated Circuits), semiconductor chips, etc. An active element may also implement a combination of one or more of the aforementioned elements; for example, an active element may comprise a combination of a transistor and a diode.

Semiconductor elements as referred to herein may be implemented as power semiconductor elements. For example, active power semiconductor elements may comprise one or more of power transistors, power diodes, etc. Power semiconductor chips or circuits can, for example, comprise power bipolar transistors, IGBTs (insulated gate bipolar transistors), power MOSFETs (metal oxide semiconductor field-effect transistors), etc. Power circuits or power chips may additionally include control circuitry, control logic, logic ICs, microprocessors, micro-controllers, etc.

According to one approach practiced in the field, a semiconductor element may be categorized as a power element if it is adapted for a maximum current of, for example, 1 ampere or more. Additionally or alternatively, an element can be categorized as power element, if it is adapted for a maximum voltage of, for example, 24 volt or more, or 50 volt or more. Additionally or alternatively, an element can be categorized as power element, if it is adapted for a maximum power loss of, for example, 1 watt or more, or 2 watt or more. Additionally or alternatively, a structural definition of a power element may comprise the requirement that (voltage) supply means such as power electrodes are arranged on both an upper and a lower surface area of the element.

A power semiconductor device, for example a power chip or a power package, may comprise at least one power semiconductor element. In one example embodiment, a power chip may comprise one or more power semiconductor elements, for example active elements such as power transistors, power diodes, etc., and/or passive elements such as resistors, capacitors, inductors, etc., wherein the power elements may be adapted for power applications, high frequency (HF) applications, and/or high voltage (HV) applications, etc. One embodiment of a logic chip (IC chip) may comprise a logic circuit for controlling power semiconductor elements such as those described above, wherein the chip may or may not be adapted for power conditions such as high frequencies and/or high voltages.

Disclosure is directed to packages herein, wherein the term 'package' may be understood as referring to a material structure provided around a component such as, for example, a single chip or multiple chips. A power package as referred to herein may encapsulate one or more power chips, and an IC package may encapsulate one or more logic chips. A package may also include contact terminals, such as contact pads, leads or pins for connecting the chip or chips externally, i.e. for the contact terminals being accessible from a component outside the multi-chip package. A package may comprise, for example, a housing provided for incorporating one or more chips, and/or an encapsulant material for encapsulating the chip. According to various embodiments, one or more outer surfaces of an encapsulant body resulting, for example, from a deposition of an encapsulant material, may form a package housing.

According to various embodiments, an encapsulation material may comprise a polymeric material, such as an epoxy resin, polyimide, polyimide-polymer. The encapsulation material may comprise a filler material, such as, for example, a particle material, comprising for example oxide particles such as SiO2, AlO2, or a fiber material, comprising for example carbon fibers, glass fibers, etc. Various other materials from the molding field may additionally or alternatively be selected.

Packages adapted for housing or encapsulating a single chip may be referred to as single-chip packages. Various aspects of the present disclosure may relate to a package implemented as, for example, a CSP (Chip Scale Package), a WLP (Wafer Level Package), eWLP (embedded Wafer Level Package), an embedded or Blade package, etc. One embodiment of a package may comprise a chip accommodated in a housing, wherein contact terminals are arranged at two surfaces of a housing, for example a bottom surface and a side surface. In a vertical arrangement, contact terminals may be arranged on opposite surfaces of a housing, wherein, for example, at least one contact terminal may be arranged at a bottom face and at least one contact terminal may be arranged at a top face of the housing.

Disclosure is directed to multi-chip packages herein, wherein multi-chip packages are understood as comprising at least two chips. According to various embodiments, each chip of the multiple chips may be accommodated in a separate housing. For example, an embodiment of a multi-chip package may comprise two chips each encased in a single-chip package such as a CSP. Various aspects of the present disclosure may relate to multi-chip packages which do not comprise any further housing apart from the multiple separate single-chip housings. For example, there may be no common housing provided for encapsulating the entirety of the chips and of the multiple separate housings of the chips.

When referring to single-chip packages as being included in an embodiment of a multi-chip package, it is to be understood that the description may apply likewise to multi-chip packages included in a multi-chip package. For example, an embodiment of a three-chip package may include a single-chip package and a two-chip package.

According to various embodiments of multi-chip packages, contact terminals for internal electrical interconnection and/or for external coupling may be arranged, for example, exclusively, at the separate housings of the single-chip packages. A contact plane of a multi-chip package may define a geometrical plane, within which one or more contact terminals of the multi-chip package can be arranged. One or more contact terminals of one of the single-chip housings may be arranged in a contact plane. Embodiments of multi-chip packages may comprise that contact terminals of two or more of separate single-chip housings are arranged in a common contact plane.

According to various aspects of the present disclosure, multi-chip packages may comprise multiple common contact planes. For example, there may be a contact plane, e.g. a common contact plane, for internal interconnection of the multiple chips, and there may be a separate contact plane, e.g., a common contact plane, for connecting the multiple chips externally.

According to one example, two single-chip housings each implementing a vertical device may be arranged such that contact terminals arranged on top faces of each of the housings form a common top contact plane of the multi-chip package, while contact terminals arranged on bottom faces of each of the housings may form a common bottom contact plane of the multi-chip package.

Various aspects of the present disclosure refer to an interconnecting structure extending between separate single-chip housings of a multi-chip package. The interconnecting structure, occasionally also referred to as an interconnector herein, may provide for at least one electrical coupling between the chips encased in the separate housings. The interconnecting structure may provide one or more electrical connections between contact terminals arranged on each of the separate single-chip housings. The electrical coupling may comprise, for example, one or more conductor paths, conducting lines, etc., wherein conducting materials such as copper or other metal materials may be employed.

By means of an interconnecting structure, an interconnection between multiple chips of a multi-chip package may be achieved between multiple single-chip housings, while in a conventional multi-chip package with a common single housing an interconnection between multiple chips may be achieved inside the common single housing.

Embodiments of an interconnector may comprise additional structures, such as embedding layers, adapted for one or more of embedding and/or supporting the electrical interconnections, providing desired mechanical properties for the multi-chip package, etc. As but one illustrative, non-limiting example, a leadframe may be provided. As another example, conductor lines may be deposited on and/or embedded within a material structure, wherein a material of the additional structure may or may not be conductive.

According to various embodiments, an electrical interconnection property of the interconnector may be implemented by providing a conducting material such as a metal, a conducting polymer, etc. For any additional structure, which may or may not have insulating properties, one or more of the following materials may be employed: A PCB material, a laminate, a foil, a ceramics, an oxide material, a leadframe material, and/or other materials conventionally used, for example, for carriers in the field of single-chip packages. Generally, any materials and/or techniques, which are conventionally employed, for example, on circuit board level, could be applied for providing an interconnecting structure. Manufacturing techniques may comprise, for example, galvanic processes, Blade packaging techniques, chip-embedding techniques, etc.

The above-discussed aspects may provide for mechanical properties of an interconnecting structure such as, for example, a flexibility allowing a bending or flexing in one or more of a mounting process of a multi-chip package to a carrier, PCB (Printed Circuit Board), etc., an operation of the multi-chip package in a mounted state, where a flexibility of the package may be advantageous in response to thermal conditions, mechanical stress, etc. Generally, mechanical and/or thermal properties of a multi-chip package comprising an interconnecting structure may differ from those of a multi-chip package comprising a single housing for encasing multiple chips. For example, a laminate may be selected for an interconnecting structure to achieve a multi-chip package with higher mechanical flexibility than an encapsulant body formed of a mold material, while a ceramic material may be selected for an interconnecting structure to achieve a multi-chip package with higher mechanical rigidity than an encapsulant body formed of a mold material.

An interconnecting structure may be arranged between, above and/or below two or more single-chip housings. According to various embodiments of a multi-chip package, one or more first common contact planes may be provided for internal interconnection, while one or more second common contact planes may be provided for external connection. The first and second contact planes may be separate planes and may be, for example, shifted and/or rotated with respect to each other. According to one aspect, the interconnecting structure may be arranged at or in line with a common contact plane for internal interconnection, and may be arranged separate from other contact planes. In another embodiment, an interconnecting structure, which may be flat and/or may comprise bends, steps, recesses, etc., may be arranged in line with a common internal contact plane and in line with a common external contact plane.

Embodiments of multi-chip packages may comprise an electrical coupling between two contact planes outside of the single-chip housings. According to one example, an interconnecting structure may provide for such inter-plane coupling, which may comprise, for example, a coupling of an internal and an external contact plane. In one illustrative, non-limiting example, an interconnector may provide for internal interconnection and may additionally comprise a solder ball, bent portion, or other connecting element arranged within an external contact plane. A multi-chip package may provide a two-dimensional external connectivity in the form of a single (common) contact plane for external connection, while an internal connectivity may be implemented in three dimensions, for example, with the provision of one or more separate internal (common) contact planes and/or the described inter-plane coupling.

Aspects of the present disclosure relate to a gap between two separate housings, for example, single-chip housings or packages, of a multi-chip package. The gap may result from the housings being arranged in a spaced-apart relationship. For example, the housings may be arranged along a common plane, which may or may not be identical to or parallel to an internal or external common contact plane, and may be arranged along that plane with a lateral relative displacement defining the gap thereinbetween.

The term 'gap' or similar terms used throughout may be understood as referring to a minimum gap width between, for example, a pair of housings, wherein the minimum gap width may measure, according to one example, the minimum free distance between the two housings. In this example, the gap may be measured as a spacing between parallel surfaces of a pair of single-chip housings facing each other. However, in general the gap may be measured according to one or more of various approaches. According to another example, the gap may be measured as a center-to-center separation distance of a pair of housings, wherein the center points of the housings may, for example, be defined in a geometrical sense.

According to various aspects of the present disclosure, multi-chip packages may be adapted for high voltage applications, which may require that one or more creepage distances have to be observed between contact terminals. A maximum voltage to be expected during an operation of a package can require a minimum creepage distance between corresponding contact terminals. According to various embodiments, one or more of a gap between housings of a multi-chip package, an interconnector extending between the housings, and a separation of contact terminals at the separate housings may be selected according to a creepage distance.

According to one aspect of the present disclosure, a multi-chip package comprising two or more separate single-chip housings may be adapted to provide an external contact plane which is identical to or similar to an external contact plane of a conventional multi-chip package comprising a common single housing. For example, the two or more separate single-chip housings of a multi-chip package and/or the external contact terminals at the separate single-chip housings may be arranged in a two-dimensional common contact plane in a similar fashion as contact terminals arranged at a single housing of a conventional multi-chip package.

A conventional multi-chip package with a single housing accommodating multiple chips may implement a creepage distance by providing at least one pair of contact terminals at the housing with a corresponding mutual separation. As a result, the creepage distance to be observed translates into a minimum size of the housing. Structural properties of the housing such as the amount of mold material or a size/extension of an internal chip carrier have to be selected accordingly. Providing, for example, a leadframe of required size as the chip carrier can contribute markedly to the costs of the package.

According to various aspects of the present disclosure, in a multi-chip package with separate housings, for example single-chip housings, the implementation of a creepage distance may comprise providing a gap between the separate housings. According to some embodiments, dimensions of the single-chip housings therefore may be selected independent of the creepage distance. For example, the single-chip housings may be CSPs, WLPs, etc. Consequently, a multi-chip package implementing a HV application can be designed more cost-efficiently. For example, the need to implement a creepage distance has less influence on a total amount of mold material required, a required carrier size, e.g., a required leadframe size, etc.

A creepage distance may represent, for example, a desired distance between contact points of a multi-chip package on a PCB or other carrier. Therefore, a creepage distance implemented by a multi-chip package with a single common multi-chip housing, and a creepage distance implemented by a multi-chip package with two or more single-chip housings may be selected similar for similar applications.

Assembling a multi-chip package from, for example, multiple single-chip packages, allows that the requirements of implementing one or more creepage distances, implementing a required heat dissipation, implementing desired mechanical properties such as a flexibility of the package, implementing desired electrical properties, such as type and arrangement of contact terminals, etc., can be separately considered and optimized. For example, a gap between two single-chip housings can be bridged by an interconnecting structure, wherein the requirements on the interconnecting structure may be reduced as compared to the single, common housing of a conventional multi-chip package with regard to, for example, an amount of encapsulating material, provisions for heat dissipation, and/or other mechanical or thermal properties.

An interconnecting structure may be designed to implement a wide variety of requirements. For example, one or more properties of an interconnector, such as mechanical, thermal and electrical properties, may be chosen similar to those of a PCB, or may be chosen different. For example, the interconnector can be designed to be more flexible than a PCB, or more rigid than a PCB. According to various embodiments of the present disclosure, an interconnecting structure may be designed, for example, for implementing a desired creepage distance and for implementing a desired electrical coupling between chips, while other requirements such as thermal requirements, for example, heat dissipation requirements, are primarily assigned to other components of the multi-chip package such as the single-chip housings.

An implementation of a circuitry by means of a chip-based package may comprise that the circuitry is partitioned into separate circuit sections, wherein each circuit section is implemented on a separate chip. The multiple chips may then be encased separately, such that, for example, the package comprises multiple single-chip housings. According to various aspects of the present disclosure, the separate chips may, for example, implement separate voltage ranges, wherein an isolation between the voltage ranges is achieved by implementing a creepage distance, which may comprise that, for example, the single-chip housings are arranged with a gap thereinbetween.

Implementing voltage ranges on separate chips allows implementing HV applications on the basis of low voltage (LV) chips, wherein the LV chips may implement, for example, a complex logic by means of a plurality of semiconductor elements with a small footprint.

A common contact plane may be assigned to low voltage differences. For example, an interconnector implementing an internal common contact plane may provide a common voltage basis (e.g., ground) to multiple chips. A common contact plane may be assigned to high voltage differences, which may comprise that a group of contact terminals with low voltage differences is arranged in one area of the contact plane, while another group of contact terminals is arranged at a distance, such as a creepage distance, therefrom. A contact plane representing low voltage differences, and a contact plane representing high voltage differences may be arranged separately from each other. For example, in a multi-chip package comprising multiple power chips with top and bottom surface, a bottom common contact plane can be provided for high voltage differences, while a top common contact plane can be provided for low voltage differences.

Various aspects of the present disclosure may comprise that a gap which is defined between two housings of a multi-chip package is available for arranging further semiconductor elements, devices, packages, etc. therein. For example, one or more active or passive semiconductor elements may be arranged on a PCB such that they fit into the gap, wherein the element or elements may be mounted before or after the multi-chip package. Additionally or alternatively, the gap between two housings of a multi-chip package may be partially or entirely filled, for example by a filler material.

FIG. 1 is a circuit diagram illustrating an example 100 of an electronic device, which may implement a HV application such as, for example, a power converter, AC/DC converter, a ballast, a lamp ballast, etc.

An input stage 102 of the electronic device 100 may implement a rectifying component and may be adapted for receiving an AC of, for example, between 85 volts to 265 volts. An inductor 104, a power transistor 106, a power diode 108, and a capacitor 110 may form a HF switching component which may be operable at switching frequencies in the range of, for example, 40 kHz to 60 kHz, or more. Each of a semiconductor device 112 and semiconductor device 114 may comprise a combination of a power transistor and a power diode. The devices 112 and 114 may cooperatively operate, in combination with further semiconductor elements such as an inductor 116 and a capacitor 118, to implement a further rectification component of converter 100 configured for a DC output. An input power and/or an output power of the device 100 might be in the range of, for example, 18 watts to 200 watts.

The power converter 100 may implement one or more power packages, for example, multi-chip packages. For example, a power package 120 is indicated with a dashed line in FIG. 1 as comprising power transistor 106 and power diode 108. According to one embodiment, the transistor 106 may be implemented on a first chip, and the diode 108 may be implemented on a second chip. A power package 122 and a power package 114 may implement the transistor/diode combinations 112 and 114, respectively. One or more of the transistors 106, 112, and 114 may, for example, be implemented as p-channel FETs (Field Effect Transistors). According to one embodiment, each of the power packages 120, 122 and 124 may be implemented as a multi-chip package or multi-chip module (MCM).

With exemplary reference to power package 120, high voltages may occur during an operation of device 100, for example, between anode A and cathode C of power diode 108, and/or between drain D and source S of transistor (switch) 106, e.g. between nodes 128 and 130.

Figure 2:
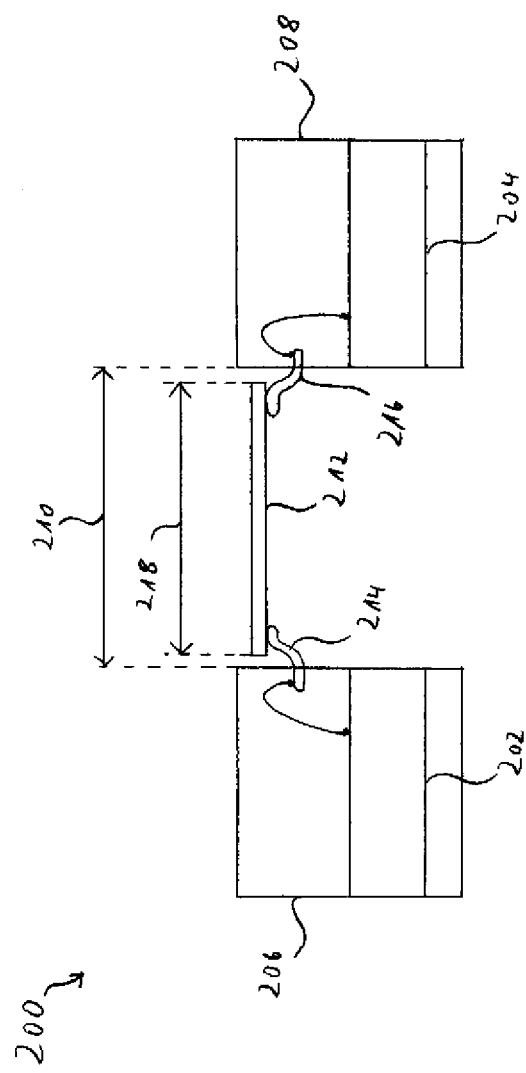
FIG. 2 schematically illustrates a first embodiment of a multi-chip package according to the present disclosure.

FIG. 2 schematically illustrates an example 200 of a multi-chip package. The package 200 comprises a first chip 202 and a second chip 204, wherein the first chip 202 is accommodated in a first housing 206 and the second chip 204 is accommodated in a separate second housing 208. The package 200 may be an implementation of one or more of the packages 120, 122, and 124 of FIG. 1. For example, when the multi-chip package 200 implements the power package 120 of FIG. 1, the chips 202 and 204 may implement the power semiconductor elements 106 and 108, respectively.

The first and second housings 206 and 208 in FIG. 2 are arranged in a laterally spaced-apart relationship and thereby define a gap 210 therein between. An interconnecting structure 212 spans the gap 210 and electrically couples the first 202 and second 204 chips to each other. Contact terminals 214 and 216 are provided at housings 206 and 208, respectively. The interconnecting structure 212 establishes electrical contact between terminals 214 and 216. For example, the interconnecting structure 212 may comprise an electrically conducting material, e.g., a metal.

As illustrated in FIG. 2, the interconnecting structure 212 has a dimension 218 which corresponds to gap 210, but which is not identical to gap 210. Specifically, the interconnector 212 is somewhat shorter than the spacing 210, wherein the dimension 218 is sufficient for interconnecting terminals 214 and 216, i.e. the dimension 218 may be selected in order for a reliable electrical connection to be established. According to other embodiments, a dimension of an interconnecting structure may also be larger than a gap between two chip housings.

Figure 3:
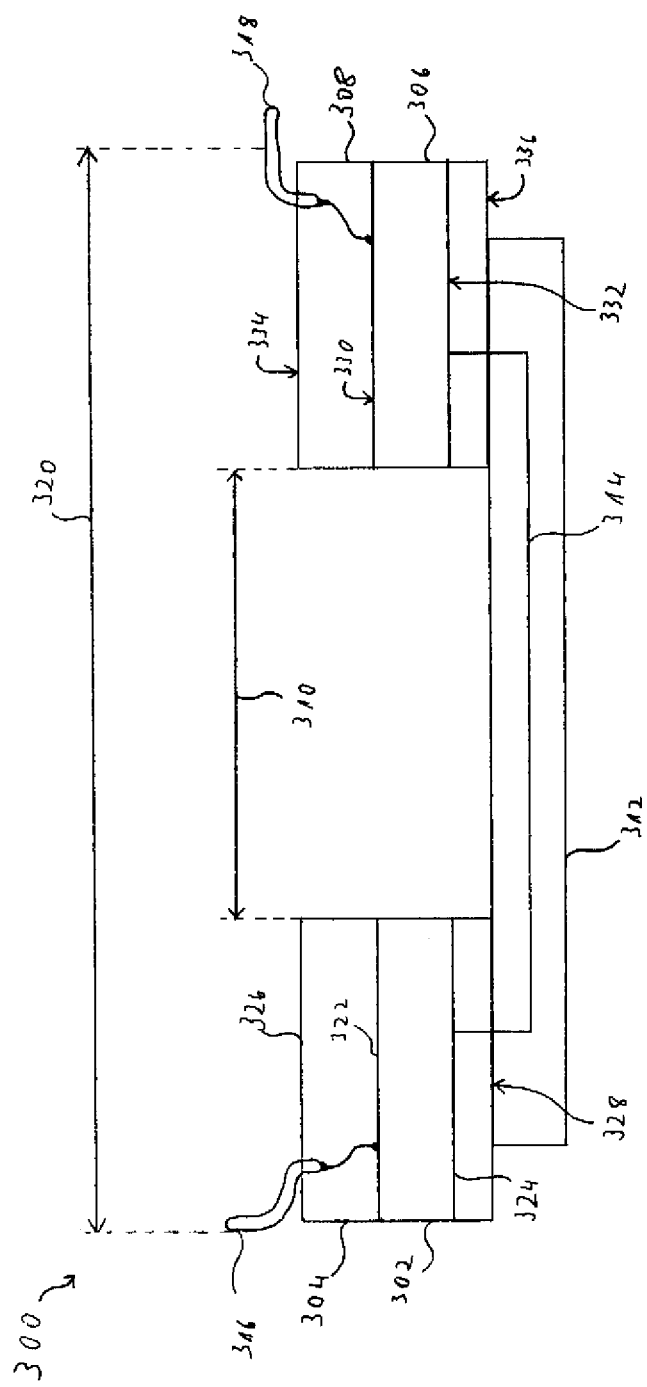
FIG. 3 illustrates a second embodiment of a multi-chip package according to the present disclosure.

FIG. 3 illustrates various aspects of the present disclosure with an embodiment 300 of a multi-chip package. The package 300 may be an implementation of one or more of the packages 120, 122, 124, 200 of the previous figures. The package 300 comprises a first chip 302 accommodated in a first housing 304, and a second chip 306 accommodated in a second housing 308. The housings 304 and 308 are arranged with a gap 310 therein between. An interconnecting structure 312 spans the gap 310 and is configured to electrically couple the chips 302 and 306, as schematically indicated by an electrical connection 314.

Contact terminals 316 and 318 are provided at each housing 304 and 308, respectively, for external connection, wherein the terminals 316 and 318 do not define a common contact plane but are individually adapted for connection with other components or carriers. A distance 320 between the terminals 316 and 318 may represent a desired creepage distance which may have been selected according to, for example, a specific HV application. The multi-chip package 300 is another example for a configuration wherein the spacing 310 between the housings 304 and 308 is related to the creepage distance 320, but is not identical thereto. Instead, the spacing or gap width 310 depends further on properties such as position and arrangement of terminals 316, 318, sizes of the housings 304, 308, etc. It is to be noted that the spacing 310 as illustrated in FIG. 3 may represent a minimum gap width between the housings 304 and 308.

Chips 302 and 306, as well as housings 304 and 308, respectively, are illustrated as vertical devices in FIG. 3, i.e. are contacted on opposing surfaces. For example, chip 302 is contacted on opposing surfaces, namely top 322 and bottom 324 surfaces, housing 304 is contacted on opposing surfaces, namely top 326 and bottom 328 surfaces, chip 306 is contacted on opposing surfaces, namely top 330 and bottom 332 surfaces, and housing 308 is contacted on opposing surfaces, namely top 334 and bottom 336 surfaces.

Figure 4:
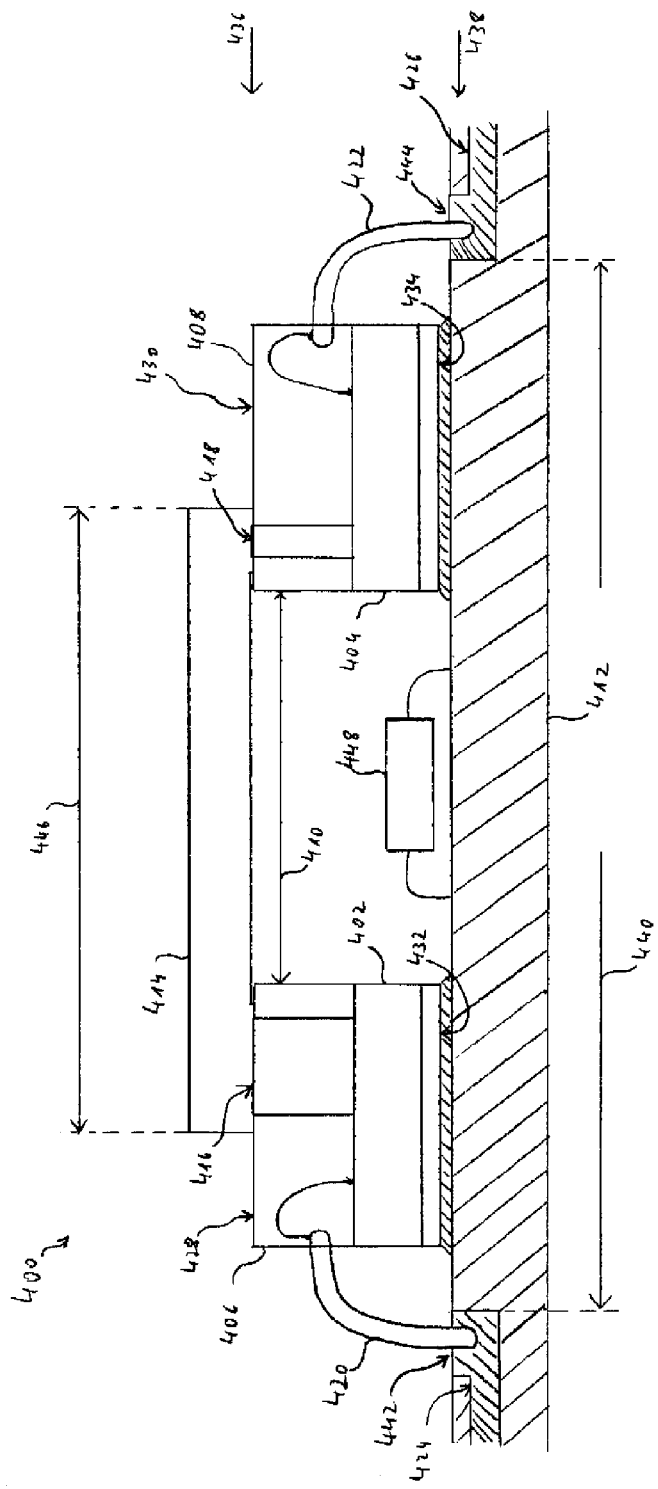
FIG. 4 illustrates a third embodiment of a multi-chip package according to the present disclosure.

FIG. 4 illustrates various aspects of the present disclosure with an embodiment 400 of a multi-chip package. The package 400 may be an implementation of one or more of the packages 120, 122, 124, 200, and 300 of the previous figures. The package 400 comprises a first chip 402 and a second chip 404 encased within housings 406 and 408, respectively. The single-chip housings 406 and 408 are arranged on a carrier 412 with a gap indicated by a gap width or spacing 410 in FIG. 4. The package 400 further comprises an interconnecting structure 414 spanning the gap 410 and electrically coupling the chips 402 and 404 via contact pads 416 and 418 provided at the housings 406 and 408. The package 400 further comprises contact terminals 420 and 422 for external connection to, for example, conductor paths 424 and 426 of carrier 412.

Both housings 406 and 408 are configured as vertical devices, wherein the contact pads 416 and 418 are arranged on a top face 428 and 430, respectively, thereof for interconnection of the chips 402 and 404 via interconnector 414, while contact leads 420 and 422 provide for external connectivity via bottom surfaces 432 and 434, respectively. Contact pads 416 and 418 of both housings 406 and 408 conform to one and the same, i.e. common, internal contact plane 436. Therefore the package 400 comprises the plane 436 as a common contact plane for internal interconnection of the chips 402 and 404. Further, contact leads 420 and 422 of both housings 406 and 408 conform to one and the same, i.e., common, external contact plane 438. Therefore the package 400 comprises the plane 438 as a common contact plane for external connection of the package 400.

With regard to an external connection of package 400, provision of the common external contact plane 438 enables that the package 400 may be mounted to a carrier such as carrier 412 in much the same way as a conventional multi-chip package with a single common housing only. For example, contact leads 420 and 422 may be implemented similar to leads of conventional packages. A spacing 440 between contact points 442 and 444 at carrier 412 may, for example, represent a desired creepage distance. The spacing 440 is represented between contact leads 420 and 422. Consequently, the carrier 412 does not require specific adaptation, for example with regard to contact points 442 and 444, to the multi-chip package 400 comprising multiple single-chip housings 406 and 408 when compared to conventional packages.

In order to arrange the terminals 420 and 422 with the mutual spacing 440, for example the gap width 410 may be selected accordingly. For example, the separation space 410 between the housings 406 and 408 may be selected, to arrive at the terminal distance 440, dependent on given lateral dimensions of housings 406 and 408, an arrangement and configuration of the contact terminals 420 and 422, etc.

The interconnecting structure 414 may be designed to support an electrical interconnection of chips 402 and 404, provide desired mechanical properties to package 400, etc. The interconnecting structure 414 may, for example, comprise one or more metal structures identical to or similar to lead-frame-type structures.

The interconnector 414 is illustrated in FIG. 4 as covering in part top surfaces 428 and 430 of housings 406 and 408. Therefore, for the example package 400 a dimension 446 of interconnector 414 may be larger than gap 410 between housings 406 and 408, but smaller than creepage distance 440. While in general a size of an interconnector may neither be equal to a separation space between single-chip housings of a multi-chip package, nor be equal to a creepage or solation distance, a required size 446 of interconnector 414 can be calculated in a similar way as described above for gap width 410. For example, the extension 446 may be dependent on the desired creepage distance 440, the gap width 410, sizes and arrangement of contact pads 416 and 418, etc.

A semiconductor element 448 is arranged between housings 406 and 408 within gap 410. The element 448 may be separate from package 400, i.e. may not form part of package 400. The element 448 may or may not be electrically coupled with carrier 412 and/or package 400. The element 448 may comprise one or more passive semiconductor elements including, for example, a resistor, inductor or capacitor, and/or may comprise one or more active semiconductor elements, for example, a single-chip package, CSP, WLP, etc. An arrangement of further semiconductor elements or components in gaps provided between separate single-chip housings of multi-chip packages such as indicated with FIG. 4 increases a design flexibility with regard to an assembly of components on carriers, substrates, PCBs, etc. For example, a component density on a carrier can be increased.

Figure 5A:
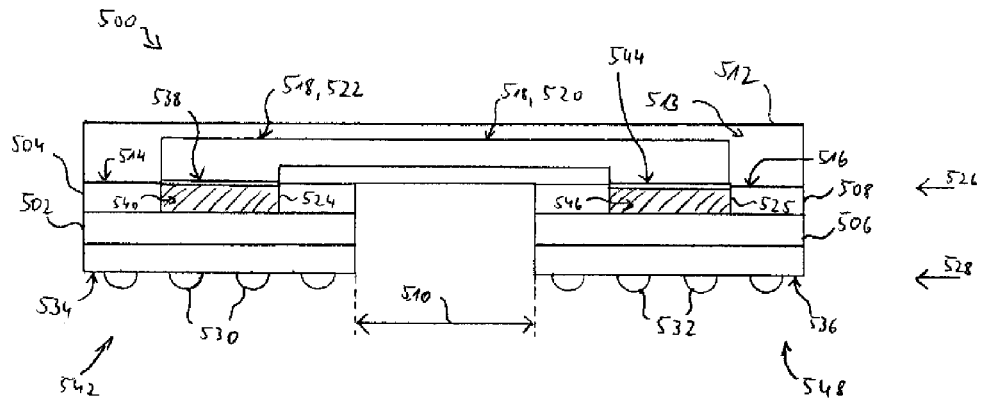
FIGS. 5A and 5B illustrate a fourth embodiment of a multi-chip package in a partially transparent side view and top view.
Figure 5B:
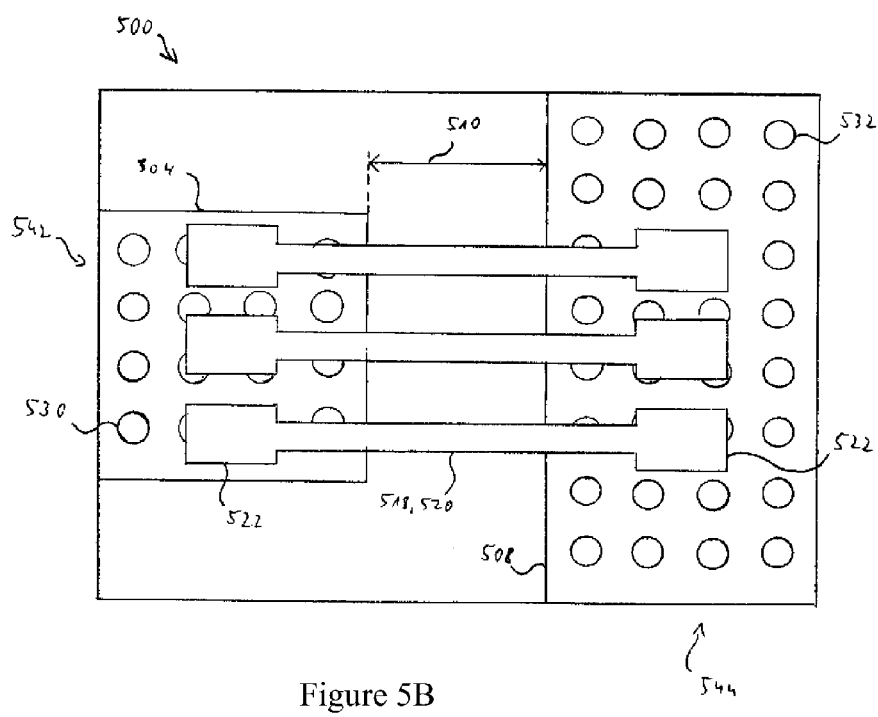

FIGS. 5A and 5B schematically illustrate a multi-chip package 500 in a partially transparent side view (FIG. 5A) and top view (FIG. 5B). The package 500 may be an implementation of one or more of the packages 120, 122, 124 of FIG. 1. The package 500 comprises at least one chip 502 accommodated in a housing 504 and at least one chip 506 accommodated in a housing 508. Each of the separate single-chip housings 504 and 508 may be implemented, for example, as CSPs, WLPs, etc. The housings 504 and 508 are arranged laterally side-by-side and with a spacing 510. An interconnecting structure 512 extends over top surfaces 514 and 516 of housings 504 and 508, respectively, and thereby spans the gap 510 therebetween.

The structure 512 may comprise, for example, a laminate 513. Multiple conducting lines 518 provide for an electrical coupling of first chip 502 and second chip 506. As can best be seen in FIG. 5B, the conducting lines 518 may each comprise a conducting path 520 connecting contact areas 522 arranged for establishing contact with corresponding contact pads of housings 504 and 508. The conducting lines 518 may be made of one or more conducting materials such as a metal, for example copper. The conducting lines 518 may be embedded within the laminate 513, as shown in FIG. 5A, or may be arranged at a surface of an interconnecting structure in an alternative embodiment. Combinations of these options may also be considered. Besides a laminate, a foil or other dielectric substrate may be considered for embedding or otherwise supporting conducting lines such as the lines 518.

Chips 502 and 506 as well as housings 504 and 508 are vertical devices. Dashed lines 524, 525 indicate vias, which may extend through housings 504 and 508 for enabling contact with the dies 502 and 506. Housings 504 and 508 conform to a common top contact plane 526 and a common bottom contact plane 528, the latter being defined by multiple contact terminals 530 at housing 504 and multiple contact terminals 532 at housing 508. Terminals 530 and 532 may be implemented as solder balls at bottom surfaces 534 and 536 of housings 504 and 508. By means of the contact terminals 530 and 532 arranged along common contact plane 528, electrical connection to a plane carrier such as a PCB can be established. The common contact plane 526 may allow cost-efficient provision of plane interconnecting structures such as the structure 512.

The housing 504 including chip 502, top contact pad 538 formed by a conducting material 540 filling via 524, and bottom contact balls 530 may be implemented as a single-chip package 542. Similarly, the housing 508 including chip 506, top contact pad 544 formed by upper surface of conducting material 546 filling via 525, and bottom contact balls 532 may be implemented as a single-chip package 548. For example, packages 542 and/or 548 may be implemented as CSPs, WLPs, etc., with a comparatively high number and density of circuit components compared to, for example, power chips. While corresponding logic packages, IC packages, etc., may be adapted for LV applications only, for example with respect to heat dissipation, electrical isolation, etc., the package 500 with logic chips 502 and 506 may nevertheless be employed for HV applications based on, for example, the above-discussed concept of circuit partitioning and assignment of a specific voltage range to each of the chips.

As a specific example, the package 500 may implement a gate driver, for example, for the gates of power transistors 106, 112 or 114 in FIG. 1. Drain-source voltages may be in the range of several hundreds of volts. A driving gate-source voltage may be in the range of several tenth of volts. The package 500 may be accordingly configured for operating the chips 502 and 506 in different voltage ranges. For example, chip 502 may be operated in a high voltage range, for example, in a range of voltages between 500 volts and 600 volts, while chip 506 may be operated in a low voltage range, for example, in a range of voltages between 0 volt and 100 volts. Therefore, voltage differences between pairs of contact balls 530, or between pairs of contact balls 532, may be less or equal to 100 volts, while a voltage difference between a pair of a contact ball 530 and a contact ball 532 may be larger than 100 volts, and may, for example, be larger than 500 volts.

Because the package 500 may be used in this way for HV applications, the gap width 510 between housings 504 and 508 has to be selected accordingly, i.e. such that contacts 530 and contacts 532 may be spaced apart by a sufficient minimum isolation distance (creepage distance) for creepage clearance. As has been discussed with reference to previous figures, the spacing 510 between the single-chip housings of package 500 may be smaller than the creepage distance as measured, for example, between contact points on a PCB. Nevertheless, a spacing between housings such as spacing 510 in FIG. 5A is sometimes for short itself referred to as 'isolation distance' herein.

One or both of the housings 504 and 508 may be formed of an encapsulant material such as an epoxy resin or a polyimide, or a composition thereof. The encapsulant material may additionally comprise a filler material such as, for example, particles of an oxide, fibers of glass or carbon, etc.

The interconnecting structure 512 may be manufactured from, for example, a polymer material, a polyimide material, one or more polyester films, etc., wherein the conducting lines 518 may be embedded therein. The interconnecting structure 512 may be configured flexible or rigid, and may, for example, be configured to achieve a desired mechanical stability for storage and shipping, mounting, and/or an operation of the package 500 in a mounted state.

Figure 6A:
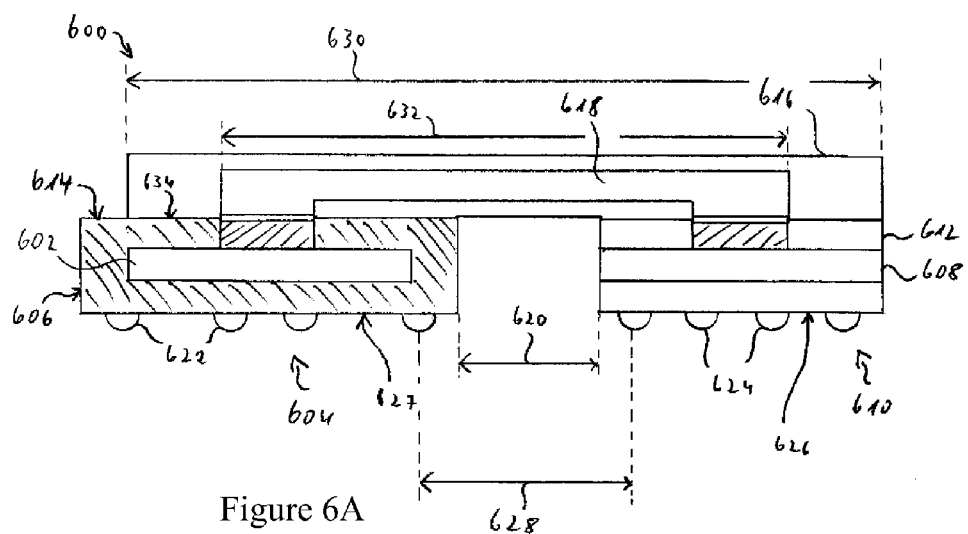
FIGS. 6A and 6B illustrate a fifth embodiment of a multi-chip package in a partially transparent side view and top view.
Figure 6B:
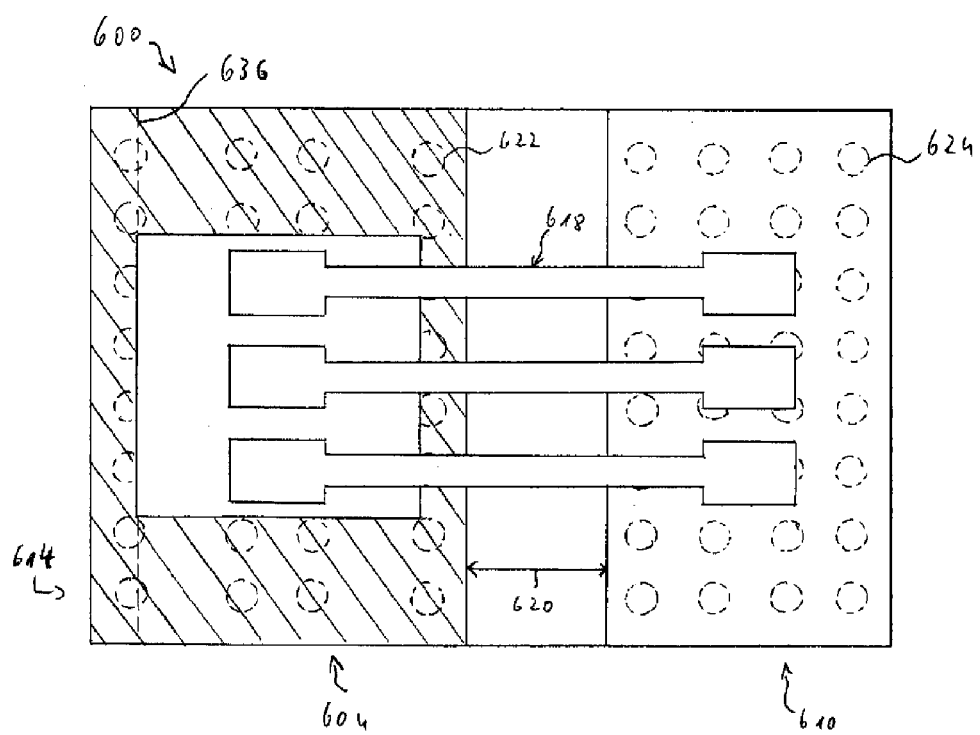

FIGS. 6A and 6B illustrate various aspects of the present disclosure with reference to an exemplary multi-chip package 600 in a partially transparent side view (FIG. 6A) and top view (FIG. 6B). The package 600 may be an implementation of one or more of the packages 120, 122, 124 described hereinabove. Aspects of package 600 not explicitly referred to below can be assumed to be similar to corresponding aspects of, for example, package 500 of FIG. 5, unless explicitly stated otherwise.

The multi-chip package 600 comprises a chip 602, which is part of a single-chip package 604, chip 602 being encased in a housing 606 of package 604. The package 600 further comprises a chip 608, which is part of a single-chip package 610, chip 608 being encased in a housing 612 of package 610. The package 610 may be implemented as a WLP, for example a WLB (Wafer Level Ball grid array), while package 604 is implemented as an eWLB (embedded Wafer Level Ball grid array) and therefore comprises a fan-out area 614, which will be described in more detail below. An interconnecting structure 616 provides for an electrical coupling of chips 602 and 608 via conducting lines 618.

Packages 604 and 610 are arranged with spacing 620 thereinbetween, which may be selected in order for a minimum isolation distance 628 to be established between contact terminals 622 of package 604 and contact terminals 624 of package 610 for an intended HV operation. It is noted that the creepage distance 628 is indicated in FIG. 6A as a center-to-center separation of a pair of contacts 622, 624. Other ways of measuring a creepage distance may additionally or alternatively be used.

Contacts 624 of single-chip package 610 are arranged below chip 608, i.e. a bottom surface 626 of package 610 corresponds to the footprint of chip 608 (fan-in). Contacts 622 of single-chip package 604 may be arranged below chip 602, and/or may be arranged in the fan-out area 614, i.e. a bottom surface 627 of package 604 is larger than the footprint of chip 602. As the spacing 620 between housings 606 and 612 depends primarily on the creepage distance 628, and therefore a desired minimum separation between contacts 622 and 624, a type or design of the packages 604, 610, such as fan-in design or fan-out design, is not of primary importance. Therefore, additionally or alternatively other packages types can be employed.

Both a size 630 of the interconnecting structure 616, and a size 632 of conductor lines 618 are larger than the creepage distance 628 and the spacing 620 between fan-out package 604 and fan-in package 610. As indicated by dashed line 636 in FIG. 6B, the interconnector 616 extends partially over top face 634 of package 604, covering essentially a top contact area over chip 602. According to other embodiments, an interconnecting structure may cover a top surface of a package with fan-out area to a lesser or greater degree, and may for example cover a top surface entirely.

Figure 7A:
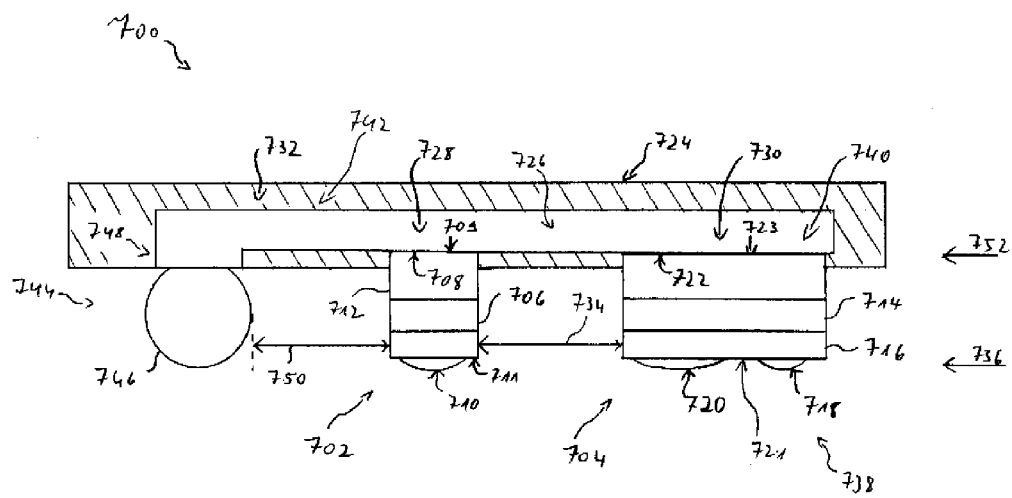
FIGS. 7A and 7B illustrate a sixth embodiment of a multi-chip package in a partially transparent side view and top view.
Figure 7B:
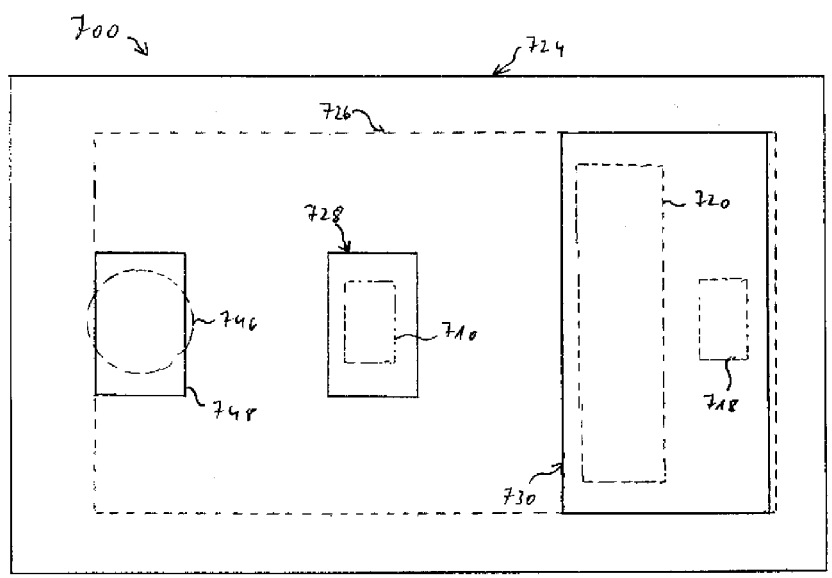

FIGS. 7A and 7B illustrate various aspects of the present disclosure by means of a multi-chip package 700 in a partially transparent side view (FIG. 7A) and top view (FIG. 7B). The package 700 may be an implementation of one or more of the packages 120, 122, 124, of FIG. 1.

The multi-chip package 700 comprises power chip packages 702 and 704, wherein single-chip package 702 may implement a power diode, and single-chip package 704 may implement a power transistor. The package 702 may comprise a chip 706, an anode contact 708 on a top surface 709 and a cathode contact 710 on a bottom surface 711, and a housing 712. The package 704 may comprise a chip 714 embedded within a housing 716, a gate contact 718 and a source contact 720 on a bottom surface 721, and a drain contact 722 on a top surface 723.

An interconnecting structure 724 extends over top surfaces 709, 723 of packages 702 and 704, and comprises a conducting layer 726 including contact terminals 728 and 730 for electrical coupling to anode contact 708 of package 702 and drain contact 722 of package 704. The conducting layer 726 may comprise a conducting material such as a metal. A material 732 into which the conducting layer 726 is embedded may comprise, for example, a ceramic material and/or other materials with high rigidity or stiffness as compared to, for example, a single multi-chip housing of a conventional multi-chip package. In this way, rigid properties for the multi-chip package 700 can be established. The conducting layer 726 may be formed, for example, by galvanic deposition.

By means of their fixation to structure 724, single-chip packages 702 and 704 are arranged with a spacing 734 between the respective housings 712 and 716. Referring exemplarily to a configuration such as illustrated with power diode 108 and power transistor 106 in FIG. 1, a voltage difference between cathode contact 710 of diode 702 and source contact 720 of transistor 704 can be of the order of several hundreds of volts. Appropriate isolation distances (creepage distances) have to be observed for creepage clearance, for example, on a carrier onto which multi-chip package 700 may be mounted. The spacing 734 has to be selected accordingly. As an example, for voltages of about 500 volts, a creepage distance of 3 millimeters or more might have to be observed which may translate into a spacing 734 of the same value for the configuration of the chip-scale single-chip packages 702 and 704 illustrated in FIGS. 7A and 7B. Example values for the spacing or gap width 734 comprise values of at least 1 millimeter, or of at least 5 millimeter, or of at least 1 centimeter.

Contact 710 of package 702 and contacts 720 and 718 of package 704 are arranged in a common contact plane 736 for external connection of package 700. With regard to transistor package 704, the source 720 and gate 718 electrode may represent an LV contact area 738 with voltage differences of less than, for example, 100 volts, while the drain 722 electrode may form a HV contact area 739 in the sub-module 704 for a HV switch (transistor) as it may be implemented, for example, in a PFC (Power Factor Compensation) stage.

The diode package 702, which may be implemented, for example, as a SiC diode, may be arranged with anode contact 708 electrically coupled via connector 726 with drain 722 of transistor 704. It may be desirable to provide all connections to external in the common two-dimensional contact plane 736. In order that the anode contact 708 may be present in contact plane 736, the conducting layer 726 comprises an extension 742 for bridging from a common internal contact plane 752 defined by electrodes 708 and 722 to the external contact plane 736. The extension 742 may comprise a contact portion 744 which is illustrated in example package 700 as comprising a solder ball 746 connected to extension 742 via contact area 748.

Connections to external may be achieved via the two-dimensional common contact plane 736. Also the internal interconnections are arranged in a common plane, namely the internal contact plane 752. Two-dimensional arrangement of internal interconnections may allow a cost-efficient manufacture of, for example, the interconnecting structure 724 as a plane or layer-type structure. Conducting layer 726 may be embedded therein during a manufacturing process of the interconnector 724 and/or a manufacturing process of the multi-chip package 700.

High voltage differences of, for example, several hundreds of volts may occur between contact 746 on the one hand and one or more of contacts 710, 720 and 718 on the other hand. In order for establishing a corresponding creepage distance, a separation 750 is provided between anode contact 746 and cathode contact 710 of diode 702. For example, the spacing or gap 750 may have a width of at least 1 millimeter, or of at least 5 millimeter, or of at least 1 centimeter. The spacing 750 may be selected the same as spacing 734, or may be larger or smaller. It is noted that multiple gaps or spacings between housings (for example, single-chip housings) and/or bridging structures such as ball 746 may differ from each other even in case one and the same creepage distance has to be implemented, which is due the fact that the gaps or spacings have to be selected dependent on housing dimensions, contact terminal arrangements at the housings, etc.

Figure 8:
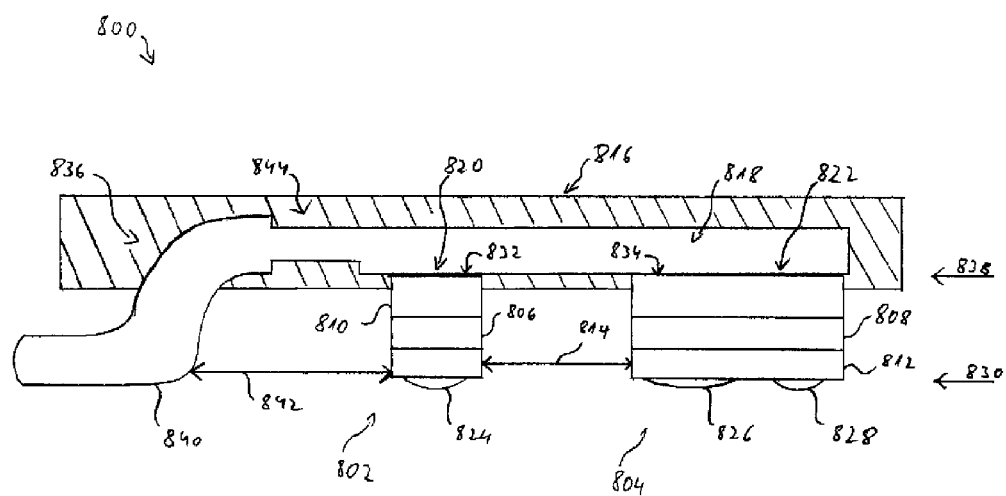
FIG. 8 illustrates a seventh embodiment of a multi-chip package in a partially transparent side view.

FIG. 8 schematically illustrates an embodiment 800 of a multi-chip package in a partially transparent side view. The package 600 may be an implementation of one or more of the packages 120, 122, 124 described hereinabove. Aspects of package 800 not explicitly referred to below may be assumed to be similar to corresponding aspects of, for example, package 700 of FIGS. 7A, 7B, unless explicitly noted otherwise.

The multi-chip package 800 implements a power package comprising single-chip power diode package 802 and single-chip power transistor package 804 accommodating chips 806 and 808, respectively. Packages 802 and 804 comprise housings 810 and 812, respectively, which are arranged with lateral spacing 814. An interconnecting structure 816 comprises a conducting metal plate 818 with contact areas 820 and 822 for electrical coupling of chips 806 and 808 with each other.

Contact terminals 824, 826 and 828 of single-chip packages 802 and 804 are arranged in an external common contact plane 830. In order that contact 832 of package 802 and/or contact 834 of package 804 may be present in external contact plane 830, the metal plate 818 comprises an extension 836 with a bridge 840 bridging an internal contact plane 838 defined by contacts 820 and 822 and the external contact plane 830. The bridge 840 is implemented as a bent portion or curved section of plate 818 and is adapted for establishing electrical contact with a carrier onto which package 800 may be mounted.

Bridge 840 or solder ball 746 of FIGS. 7A, 7B are exemplary implementations of an electrical interconnection between separate internal and external contact planes of a multi-chip package. The bridge 840 may be arranged at a separation 842 from one or more of the single-chip housings 802, 804 of the package 800. The distance 842 may provide for the implementation of, for example, a creepage distance similar to what has been discussed above for package 700 with reference to the separation 750 between ball 746 and housing 712. Separations 814 and 842 may be selected similar, or may be selected different.

The interconnecting structure 816 may comprise a layer 844 embedding the conducting plate 818. Layer 844 may be implemented, for example, as a laminate, a foil, etc. According to one embodiment, the layer 844 may be manufactured from one or more electrically insulating materials. The interconnecting structure 816 can have rigid or flexible properties, depending on properties such as material and thickness of plate 818 and/or of embedding layer 844.

According to some embodiments, the interconnecting structure 816 can be manufactured, in a separate process, prior to a process of manufacturing the package 800. According to other embodiments, the interconnecting structure 816 is formed within the process of assembling the multi-chip package 800. For example, the metal plate 818 may be provided in a first step, the housings 802 and 804 may be mounted thereto in a second step, and the plate 818 together with adjacent portions of housings 802, 804 may be embedded within the embedding layer 844 in a third step.

Figure 9:
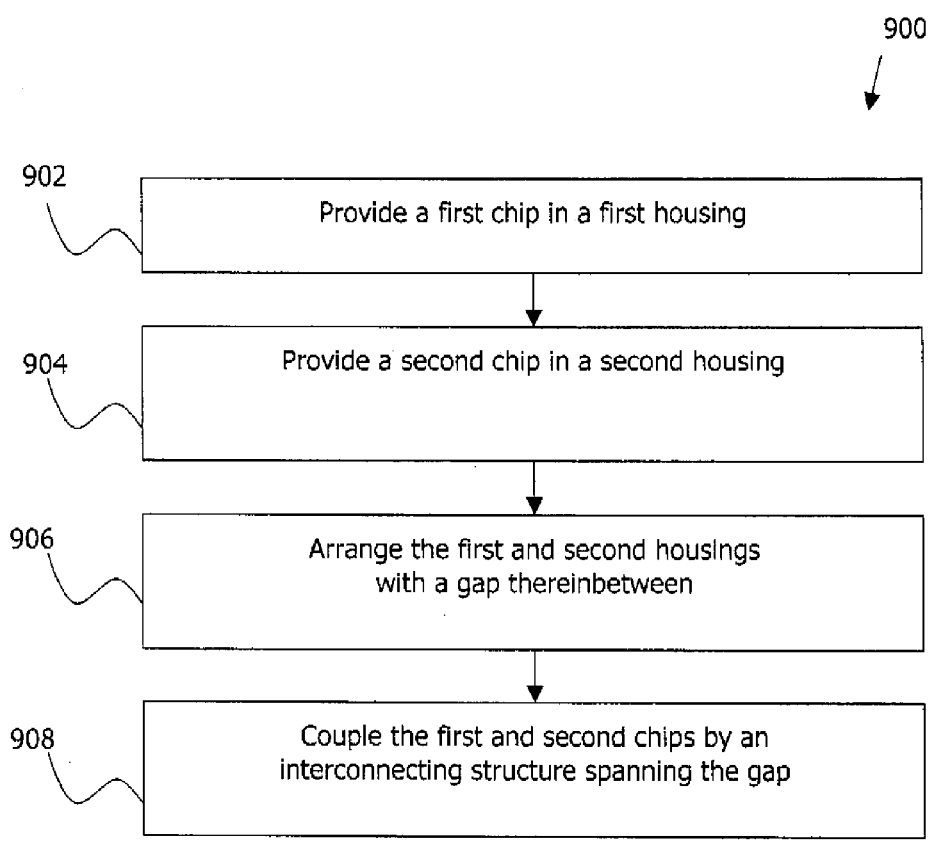
FIG. 9 is a flow diagram illustrating an embodiment of a method of manufacturing a multi-chip package.

FIG. 9 is a flow diagram illustrating various aspects of the present disclosure with reference to a process 900 of manufacturing a multi-chip package. While the method 900 is shown as comprising a particular sequence of steps 902 to 908, according to other embodiments, the sequence of steps may be changed and/or two or more steps may be performed in parallel to each other. Additional steps may be performed and/or other steps may replace one or more of the steps 902 to 908.

Figure 10A:
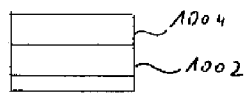
FIGS. 10A to 10E illustrate various stages of the manufacturing process of FIG. 9.
Figure 10B:
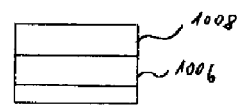
Figure 10B:
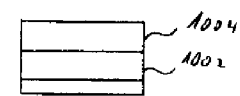

The process 900 is described with reference to FIGS. 10A to 10E. In step 902, a chip 1002 is provided and is accommodated in housing 1004 (FIG. 10A). In step 904, a further chip 1006 is provided, which is accommodated in housing 1008 (FIG. 10B). According to various embodiments, the housings 1004 and 1008 may comprise, for example, single-chip packages such as CSPs, WLPs, etc. Chips 1002 and 1006 may be of one particular type, for example may both implement diodes, transistors, power diodes, power transistors, etc. Alternatively, the chips 1002, 1006 may be of different type; for example, chip 1002 may implement a power diode, and chip 1006 may implement a power transistor. Chips 1002, 1006 may be manufactured in one process, or may be manufactured in different processes. Housings 1004, 1008 may be manufactured in one process, or in different processes. The processes of manufacturing chips 1002, 1006 and/or housings 1004, 1008 may be separate from process 900.

Figure 10C:
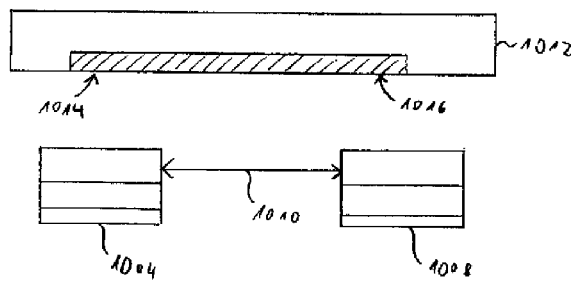

In step 906, the housings 1004 and 1008 are arranged in a laterally spaced-apart relationship, thereby defining a gap 1010 between housing 1004 and housing 1008 (FIG. 10C). A placement may be performed with reference to an interconnecting structure 1012 and specifically, for example, desired single-chip placement areas 1014 and 1016 thereof. The arrangement may comprise, for example, employment of techniques such as Pick-and-Place, other SMT (Surface Mount Technology) placement processes, placement processes known from a packaging field, a PCB field, etc. While not illustrated in the figures, some kind of flipping technique may be employed.

Figure 10D:
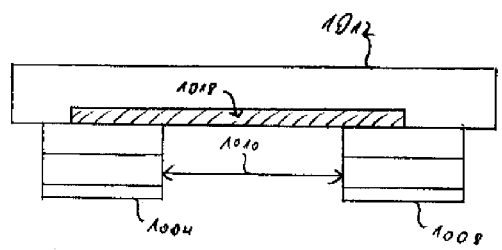
Figure 10E:
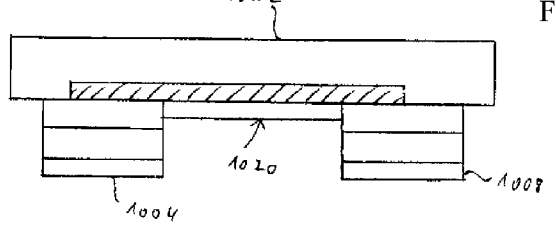

According to step 908, the chips 1002 and 1006 are electrically coupled by the interconnecting structure 1012, which is configured to span the gap 1010 between housings 1004 and 1008 (FIG. 10D). The housings 1004 and 1008 may be arranged with respect to a conducting line 1018 of interconnecting structure 1012 for electrical coupling. The step 908 may comprise an at least partial filling of the gap 1010 by, for example, a layer 1020 (FIG. 10E). The layer 1020 may be made of an electrically insulating material, for example, for insulating the electrical connection 1018 from an environment.

According to one embodiment, the layer 1020 may be formed of a thermosetting material, such as a b-stage material. Instead of forming layer 1020 after placement and mounting of housings 1002 and 1004, such layer may also be formed prior to or in parallel to a placement and/or mounting of the single-chip housings.

A flexibility of the interconnecting structure 1012 may be selected according to a desired application of the multi-chip package 1000. For example, a flexibility may be selected to be similar to a flexibility of a PCB, or more flexible than a PCB, for example by implementing the structure 1012 by means of an appropriate laminate of foil, or more rigid than a PCB, for example by implementing the structure 1012 by means of a ceramic material. Mechanical properties such as the flexibility can be selected and optimized separately for each of the housing 1004, the housing 1008, and the interconnecting structure 1012, depending on a desired application.

It is noted that an electrical connection, conducting line, conductor path, etc. of an interconnecting structure may primarily be designed according to desired electrical connection properties, while other properties, for example, thermal properties such as heat dissipation properties may be of secondary importance. For example, the single-chip packages may be designed according to desired heat dissipation properties. In case, for example, a metal material such as copper is employed for electrical interconnection, due to the higher electrical than thermal conductivity of copper, a conducting path or similar structure may be designed smaller and/or thinner as compared to a conventional multi-chip package layout. For example, a conducting line of an interconnecting structure may or may not be designed for a high current; according to various embodiments, the conducting line may be designed for a high voltage, but only a low current.

According to various aspects of the present disclosure, two or more single-chip packages or housings of a multi-chip package may not be encapsulated within a further, extra housing. A desired electrical insulation of a conducting portion of the interconnecting structure can be achieved, for example, by covering the conducting portion with an insulating layer, embedding the conducting portion within an insulating material such as an appropriate laminate, etc. A desired mechanical stability of the multi-chip package may be achieved, for example, by providing the interconnecting structure with appropriate mechanical properties. Thermal dissipation properties may be controlled by accordingly designing the single-chip packages. For one or more of these reasons, a further encapsulation may not be required, and may therefore be omitted for cost reasons.

According to one example, a first, conventional package may comprise a single chip or multiple chips encapsulated within a single common housing formed, for example, by a corresponding amount of a molding material. That first package may be compared to a second multi-chip package with similar electrical functionality, wherein the second package comprises multiple chips and a corresponding number of single-chip packages which are electrically interconnected by an interconnecting structure comprising, for example, a leadframe. An amount of encapsulating (e.g., molding) material for encapsulating the multiple chips and optionally encapsulating the interconnecting structure of the second package may be less than an amount of encapsulating material of the first package, in particular if a creepage distance is implemented by a size of the single common housing in case of the first package, and is implemented by a size of the interconnecting structure in case of the second package.

Implementation of, for example, a creepage distance may involve a partitioning of a circuit into two or more circuit sections, such that the required creepage distance may be established by a corresponding mutual separation of the circuit sections. Each of the circuit sections may comprise a single chip, or multiple chips, ICs, etc., wherein each of the separate circuit sections may be accommodated into a separate housing. The creepage distance for a HV application, for example, may be implemented on the level of the electrical interconnection of the housings, e.g., single-chip packages, which is to be understood such that the creepage distance can be implemented independent of any housing or other encapsulant.

As a result, a multi-chip package (multi-chip module) may comprise at least two sub-packages (sub-modules) with a voltage difference of, for example, greater than 100 volts at operation, or of greater than 200 volts, or of greater than 400 volts, wherein the sub-packages are interconnected by a HV interconnecting structure.

In a multi-chip package comprising multiple single-chip housings, a gap with an appropriate gap width may be provided between the single-chip housings, as illustrated with various examples herein, in order to, for example, implement a creepage distance. Consequently, a design of one or more of the single-chip housings may ignore, e.g., the creepage distance aspect and may focus on other requirements, such that the single-chip housings may be optimized with regard to, for example, mechanical protection of the encased chips, heat dissipation, cost-efficient manufacture, etc. For instance, a size or dimension of a single-chip housing may not implement a creepage distance. According to one embodiment, a largest dimension of a single-chip housing, such as a length or width thereof, may be smaller than a creepage distance to be implemented.

Mechanical properties of a multi-chip package, such as its flexibility, may be varied in a wide range by means of, for example, designing the interconnecting structure accordingly.

As a result, more design options are available as compared to conventional packages comprising a single housing implemented by, for example, a molding body.

While various aspects of the present disclosure have been illustrated and described, modifications may be made thereto without departing from the scope of the appended claims. With particular regard to the various functions performed by the above-described components or structures (assemblies, devices, circuits, systems, etc.), the terms (including a reference to "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations.

As used herein, to the extent that terms such as "include," "have," "with," or variants thereof are used in either the detailed description or the claims, it is to be understood that such terms are intended to be inclusive in a manner similar to the term "comprise." The term "exemplary" or a variant thereof is meant to merely denote one or an example, rather than the best or optimum example according to any given criterion.

While a particular feature or aspect of an embodiment of the present disclosure may have been described with respect to only one of several implementations, such feature or aspect may be combined with one or more other features or aspects of the other implementations as may be desired and advantageous for any given or particular application.

While specific embodiments have been illustrated and described herein, it will be appreciated by those of normal skill in the art that many modifications may be made, adaptations be performed and variants be implemented in view of the specific embodiments shown and described without departing from the scope of the present disclosure. Accordingly, it is intended that any such modifications, adaptations and variations of the specific embodiments discussed herein are covered and the invention be limited only by the scope of the claims.

What is claimed is:

1. A multi-chip package, comprising:
   a first chip accommodated in a first housing, the first housing encapsulating a top surface and an opposite bottom surface of the first chip;
   a second chip accommodated in a second housing, the second housing encapsulating a top surface and an opposite bottom surface of the second chip, wherein the first housing and the second housing are arranged in a laterally spaced-apart relationship that defines a first gap between the first housing and the second housing;
   an interconnecting structure that spans the first gap between the first housing and the second housing and electrically couples the first chip and the second chip;
   a first contact terminal at a bottom face of the first housing; and
   a second contact terminal at a bottom face of the second housing, the first and second contact terminals being accessible by a component outside the multi-chip package.

2. The multi-chip package of claim 1, wherein the first chip is a vertical device.

3. The multi-chip package of claim 2, wherein the second chip is a vertical device.

4. The multi-chip package of claim 1, wherein the first housing has a top face and the second housing has a top face, and wherein the interconnecting structure extends at least partly over the top face of the first housing and over the top face of the second housing.

5. The multi-chip package of claim 1, wherein the first contact terminal and the second contact terminal are arranged in a common contact plane.

6. The multi-chip package of claim 5, wherein the interconnecting structure comprises a contact portion extending to the common contact plane.

7. The multi-chip package of claim 6, wherein the contact portion comprises a bent portion or a solder ball.

8. The multi-chip package of claim 7, wherein the contact portion and at least one of the first housing and the second housing are arranged in a laterally spaced-apart relationship defining a second gap between the contact portion and the at least one of the first housing and the second housing, wherein the second gap has a gap width of at least 1 millimeter.

9. The multi-chip package of claim 8, wherein at least one of the first gap and the second gap is at least partially filled with a filler material.

10. The multi-chip package of claim 1, wherein at least one of the first contact terminal and the second contact terminal comprises a solder ball or a contact pad.

11. The multi-chip package of claim 1, wherein the multi-chip package is configured to be operated with a voltage difference between the first contact terminal and the second contact terminal of greater than 100 volts.

12. The multi-chip package of claim 1, wherein the interconnecting structure comprises a leadframe.

13. The multi-chip package of claim 1, wherein the interconnecting structure comprises a ceramic substrate.

14. The multi-chip package of claim 1, wherein the interconnecting structure comprises a dielectric substrate.

15. The multi-chip package of claim 1, wherein the first chip comprises a power transistor and/or a power diode.

16. The multi-chip package of claim 1, wherein the second chip comprises a power transistor and/or a power diode.

17. The multi-chip package of claim 1, wherein the first housing comprises an encapsulant comprising one or more encapsulant materials selected from the group consisting of a polymer material, an epoxy material, a polyimide material, a filler material, a fiber material, a carbon fiber material, a glass fiber material, and a material comprising oxide particles.

18. The multi-chip package of claim 17, wherein the second housing comprises an encapsulant comprising one or more encapsulant materials selected from the group consisting of a polymer material, an epoxy material, a polyimide material, a filler material, a fiber material, a carbon fiber material, a glass fiber material, and a material comprising oxide particles.

19. The multi-chip package of claim 1, wherein the first gap has a minimum gap width of at least 1 millimeter.

20. The multi-chip package of claim 1, wherein the interconnecting structure is flexible.

21. The multi-chip package of claim 1, wherein the interconnecting structure is rigid.

22. A multi-chip package, comprising:
a first single-chip package comprising a first chip accommodated in a first housing;
a second single-chip package comprising a second chip accommodated in a second housing, wherein the first housing and the second housing are arranged in a laterally spaced-apart relationship defining a gap between the first housing and the second housing;
an interconnecting structure configured to span the gap between the first housing and the second housing and to electrically couple the first chip and the second chip; and
a first contact terminal at the first housing, and a second contact terminal at the second housing.

23. The multi-chip package of claim 22, wherein the multi-chip package is configured to be operated with a voltage difference between the first contact terminal and the second contact terminal of greater than 400 volts.

24. The multi-chip package of claim 22, wherein the multi-chip package comprises a common contact plane for internal connection, wherein the common contact plane comprises a top surface of the first housing and a top surface of the second housing, and wherein the interconnecting structure is disposed over the common contact plane and above the gap.

25. A method of manufacturing a multi-chip package, the method comprising:
arranging a first package comprising a first housing and a second package comprising a second housing in a laterally spaced-apart relationship to define a gap between the first housing and the second housing, the first housing accommodating a first chip and the second housing accommodating a second chip; and
electrically coupling the first chip and the second chip with an interconnecting structure configured to span the gap between the first housing and the second housing.

26. The method of claim 25, wherein the interconnecting structure is arranged to extend at least partly over a top face of the first housing and over a top face of the second housing.

27. The multi-chip package of claim 1, wherein the first housing is part of a first package and wherein the second housing is part of a second package, wherein the first package and the second package comprise a package type selected from the group consisting of wafer level package, embedded wafer level package, chip scale package, and blade package.

28. The multi-chip package of claim 1, wherein the interconnecting structure comprises a conductive line disposed in a mold compound.

29. The multi-chip package of claim 22, wherein the multi-chip package comprises a common contact plane for external connection, wherein the first contact terminal and the second contact terminal comprise a surface at the common contact plane.

30. The multi-chip package of claim 29, further comprising a solder ball disposed on a surface of the interconnecting structure, the solder ball having a surface at the common contact plane.

* * * * *

UNITED STATES PATENT AND TRADEMARK OFFICE
CERTIFICATE OF CORRECTION

PATENT NO. : 8,698,293 B2
APPLICATION NO. : 13/481630
DATED : April 15, 2014
INVENTOR(S) : Ralf Otremba et al.

Page 1 of 1

It is certified that error appears in the above-identified patent and that said Letters Patent is hereby corrected as shown below:

On the Title Page, Item (75) Inventors, line 2, delete "Kirchhein-Heimstetten (DE)" and insert --Kirchheim-Heimstetten (DE)--.

Signed and Sealed this
Twenty-ninth Day of July, 2014

Michelle K. Lee
*Deputy Director of the United States Patent and Trademark Office*